United States Patent [19]

Uchiya

[11] Patent Number: 5,258,608
[45] Date of Patent: Nov. 2, 1993

[54] SOLID-STATE IMAGING DEVICE WITH ANTI-REFLECTIVE LAYERS OF AMORPHOUS SILICON AND INSULATING SILICON

[75] Inventor: Satoshi Uchiya, Tokyo, Japan

[73] Assignee: NEC Corporation, Tokyo, Japan

[21] Appl. No.: 800,000

[22] Filed: Nov. 29, 1991

[30] Foreign Application Priority Data

Nov. 29, 1990 [JP] Japan .................. 2-335678

[51] Int. Cl.⁵ .............................. H01J 40/14
[52] U.S. Cl. .................... 250/208.1; 257/437
[58] Field of Search ........... 250/208.1, 216, 211 J, 250/211 R, 214.1, 214 R; 357/30 K, 30 L, 24 LR; 437/228, 229, 2, 3; 257/435, 436, 437

[56] References Cited

U.S. PATENT DOCUMENTS

| | | | |
|---|---|---|---|
| 4,592,129 | 6/1986 | Legge | 437/2 |
| 4,600,833 | 7/1986 | Shibata et al. | 250/216 |
| 4,689,873 | 9/1987 | Kramer | 437/2 |
| 4,820,611 | 4/1989 | Arnold, III et al. | 437/229 X |
| 4,827,117 | 5/1989 | Uchida et al. | 357/30 K X |
| 4,942,451 | 7/1990 | Tamaki et al. | 357/67 |
| 5,066,615 | 11/1991 | Brady et al. | 437/229 |
| 5,093,564 | 3/1992 | Miyagaki et al. | 250/208.1 |
| 5,139,974 | 8/1992 | Sandhu et al. | 437/228 |

*Primary Examiner*—David C. Nelms
*Assistant Examiner*—John R. Lee
*Attorney, Agent, or Firm*—Sughrue, Mion, Zinn, Macpeak & Seas

[57] ABSTRACT

A solid-state color imaging device comprises a semiconductor substrate having a plurality of optoelectrical conversion regions on a major surface of the substrate and an insulating layer on the major surface of the substrate. On the insulating layer is a light shielding layer having an array of holes respectively aligned with the optoelectrical conversion regions. On the light shielding layer is an anti-reflection layer to absorb light reflected from the light shielding layer. A color anti-blending layer and a color dyeing layer are successively formed on the anti-reflection layer. The color dyeing layer has an array of color filtering regions in positions which correspond respectively to the optoelectrical conversion regions.

6 Claims, 2 Drawing Sheets

SOLID-STATE IMAGING DEVICE WITH ANTI-REFLECTIVE LAYERS OF AMORPHOUS SILICON AND INSULATING SILICON

BACKGROUND OF THE INVENTION

The present invention relates to a solid-state imaging device.

A known solid-state color imaging device comprises a semiconductor substrate and an array of optoelectrical conversion regions formed on one surface of the substrate and covered with an insulating layer. A perforated aluminum layer is provided on the insulating layer to define guideways for light incident on the imaging device to the respective conversion regions. A color filter is provided on the aluminum layer, which is fabricated by depositing alternating layers of color anti-blending material such as high molecular resin and color dyes. Each color component of the filter is produced by depositing a layer of anti-blending material and a dyeing layer thereon, followed by the application of a photoresist onto the dyeing layer. The photoresist is then exposed to actinic radiation through a photomask. However, part of the incident optical energy penetrates these two layers and impinges on the underlying aluminum layer, causing irregular reflection of light. As a result, portions of the color dyeing layer which must remain in the anti-blending material are exposed to the reflecting light, leaving areas where color dyes are nonexistent. During use, white light is undesirably allowed to pass through such areas and directly impinges on the optoelectrical conversion regions, deteriorating the quality of reproduced color images. In the case of a monochromatic imaging device, the light reflecting on the aluminum layer impinges on a monochromatic filter (which is used to shield a part of the imaging area of the device from incident light as a zero level setting) and causes multiple reflections of images between them. This results in flare spots, i.e., fogged or dense area, in a reproduced image.

SUMMARY OF THE INVENTION

It is therefore an object of the present invention to provide a solid-state color imaging device capable of faithful reproduction of color images.

Another object of this invention is to provide a solid-state monochromatic imaging device in which flare spots are nonexistent.

According to a broader aspect of this invention, a solid-state imaging device is provided comprising a semiconductor substrate having a plurality of optoelectrical conversion regions on a major surface of the substrate, an insulating layer on the surface of the substrate, and a light shielding layer on the insulating layer, the light shielding layer having a plurality of holes respectively aligned with the optoelectrical conversion regions. An anti-reflection layer is provided on the light shielding layer for absorbing light reflecting off the light shielding layer.

Preferably, the anti-reflection layer comprises an underlying silicon insulating layer and an overlying amorphous silicon layer, the thicknesses of the two layers being such that a destructive interference of light is produced for absorbing light reflecting from said light shielding layer.

According to a second aspect of the present invention, a solid-state color imaging device comprises a semiconductor substrate having a plurality of optoelectrical conversion regions on a major surface of the substrate and an insulating layer on the major surface of the substrate. On the insulating layer is a light shielding layer having an array of holes respectively aligned with the optoelectrical conversion regions. On the light shielding layer is an anti-reflection layer to absorb light reflected from the light shielding layer. A color anti-blending layer and a color dyeing layer are successively formed on the anti-reflection layer. The color dyeing layer has an array of color filtering regions in positions which correspond to the optoelectrical conversion regions.

The present invention further provides a method for producing a solid-state color imaging device. According to this method, an array of of optoelectrical conversion regions is formed on a major surface of a semiconductor substrate and a first silicon insulating layer is deposited on the surface of the semiconductor substrate. A light shielding layer is formed on the first insulating layer. A second silicon insulating layer and an amorphous silicon layer are successively formed on the light shielding layer. Using a plasma etching technique, the amorphous silicon layer, the silicon insulating layer and the light shielding layer are etched for producing an array of holes respectively aligned with the optoelectrical conversion regions. The first silicon insulating layer is annealed, and a color anti-blending layer and a color dyeing layer are successively deposited, and patterned to produce an array of color filtering regions corresponding to the optoelectrical conversion regions.

BRIEF DESCRIPTION OF THE DRAWINGS

The present invention will be described in further detail with reference to the accompanying drawings, in which.

DETAILED DESCRIPTION

Figure 1A:
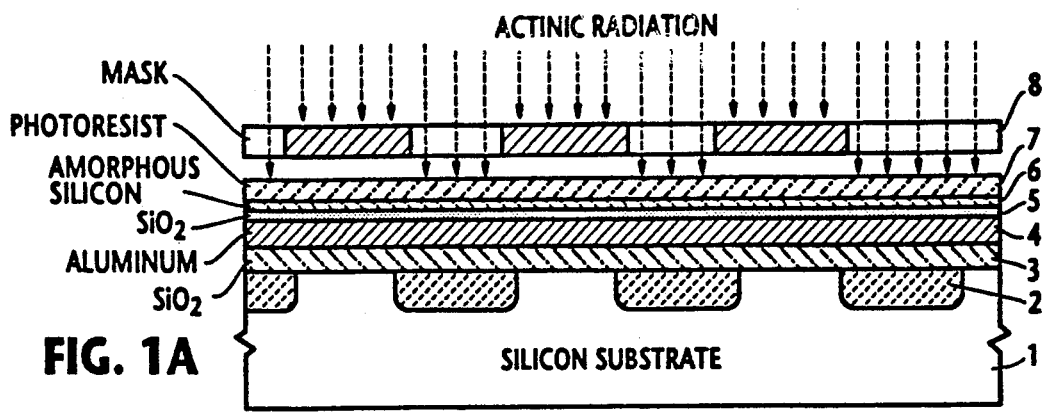
FIGS. 1A through 1E are side views of a solid-state color imaging device according to one embodiment of this invention, with each view showing a successive step of fabrication.
Figure 1B:
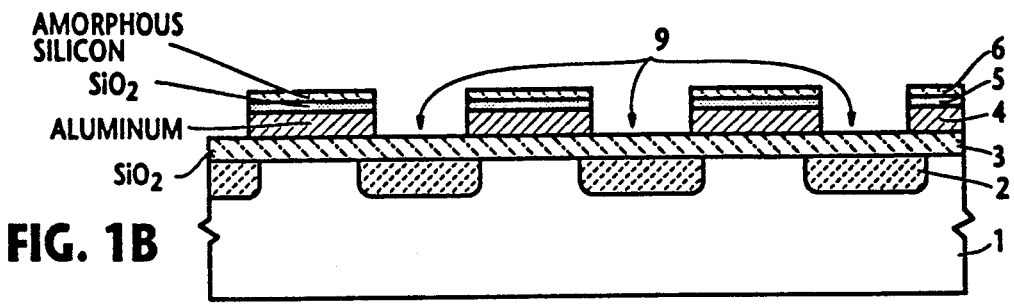

Referring now to FIG. 1A, a solid-state color imaging device of the present invention comprises a silicon substrate 1 and an array of optoelectrical conversion regions 2 which are formed on a major surface of the substrate in a well known manner. The major surface of the substrate 1 is covered with an insulating layer 3 of silicon dioxide or silicon nitride. Using a sputtering technique, a layer of aluminum 4 is deposited on the insulating layer 3 to serve as a light shield. On the aluminum layer 4 is deposited a 1000-Å thick silicon dioxide layer 5 having a light refractive index of 1.45, using a chemical vapor deposition (CVD) method. Silicon is then sputtered on the silicon dioxide layer 5 to a thickness of 300 Å, to form an amorphous silicon layer 6. The reflective index of the amorphous silicon layer 6 is 3.0. A photoresist film 7 is then applied over the amorphous silicon layer 6 and a photomask 8 is placed over the photoresist 7. Photoresist 7 is patterned by subjecting the device to a flood of radiation through photomask 8. Using a reactive ion etching (RTE) technique (or plasma etching) with a gas of the CF₄ group, layers 6 and 5 are successively etched according to the pattern of the photoresist. Aluminum layer 4 is etched using the RIE technique with a gas of chlorine group. In this way, an array of holes 9 are created through the layers 4, 5 and 6 in positions respectively corresponding to the optoelectrical conversion regions 2 as shown in FIG. 1B. Each of these holes serves as a guideway for directing incident rays to the corresponding optoelectrical conversion region.

Figure 2:
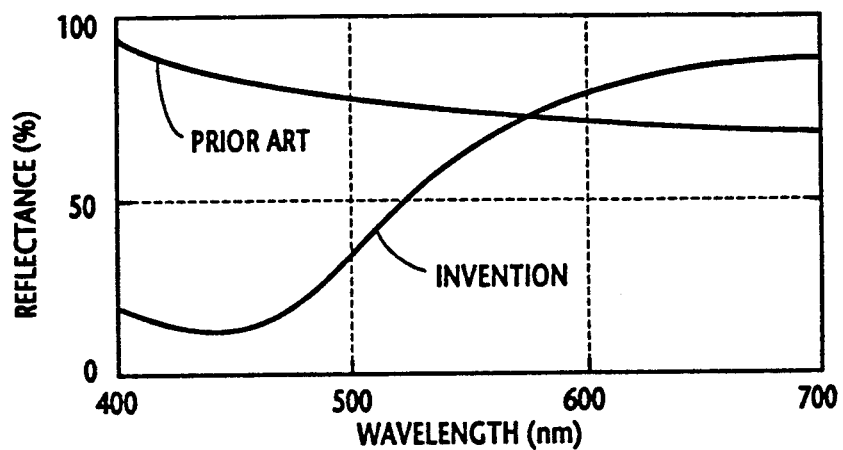
FIG. 2 is a graphic representation of the reflectance of the color imaging device of this invention in comparison with a prior art color imaging device.

The device is then subjected to an annealing process. The purpose of this process is to remove microscopic defects which might have been produced in the insulating silicon layer 3 during the plasma etching processes. Although part of reflections from the underlying aluminum layer 4 is absorbed by amorphous silicon layer 6, layers 5 and 6 combine to act as an anti-reflection layer by causing destructive interference of light to occur in the 436-nm wavelength region between rays reflecting off the aluminum layer 4 and those reflecting off the layers 5 and 6 due to the ratio of the 1000-Å thickness of the underlying layer 5 to the 300-Å thickness of the overlying layer 6. As shown in FIG. 2, experiments show that approximately 85% of reflections from aluminum layer 4 can be absorbed by the combined layers 5 and 6. Silicon insulating layer 5 has an additional feature in that if amorphous layer 6 is deposited direct on aluminum layer 4, the annealing process just described would cause it to be absorbed by the underlying aluminum and completely annihilated. Thus, the underlying silicon insulating layer 5 protects the overlying layer 6 from the annealing process.

Therefore, during patterning of a color dyeing layer, precision control of the absorption wavelength and precision control of the absorption of incident light are made possible, resulting in an improvement for reproduction of colors.

Figure 1C:
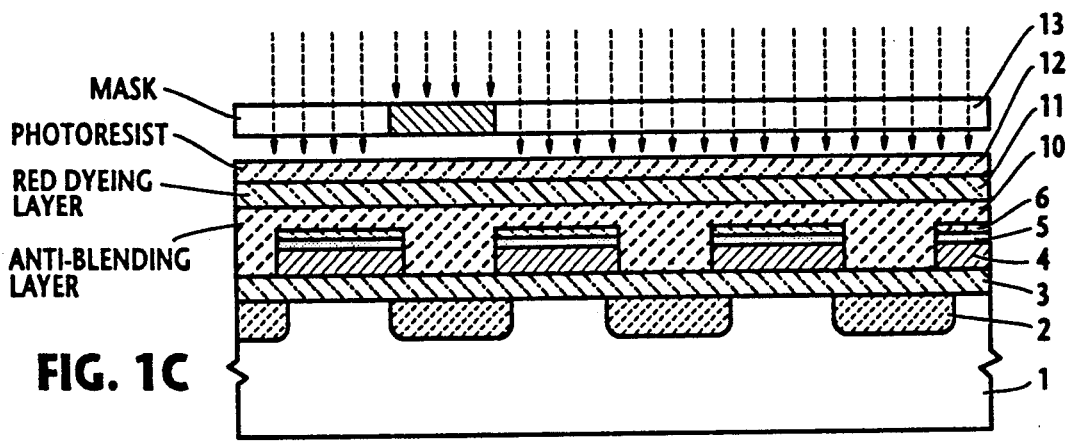
Figure 1D:
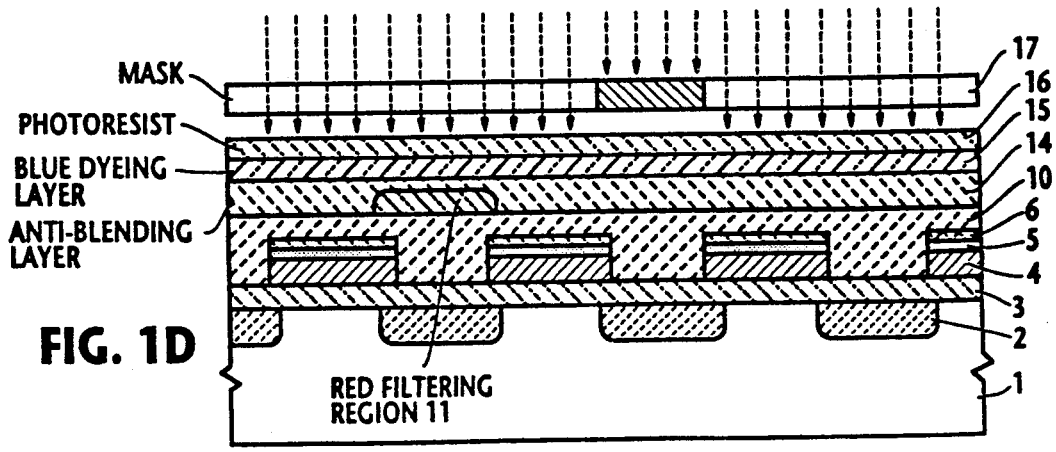

As shown in FIG. 1C, a color anti-blending layer 10 of transparent high molecular resin, such as polymethyl methacrylic acid or polyglycidyl methacrylic acid, is deposited entirely on the substrate so that the holes 9 are refilled and the layers 4, 5 and 6 are buried under the anti-blending layer. A red dyeing layer 11 is deposited on the anti-blending layer 10. The dyeing layer contains a parent material which is composed of a negative water-soluble resist such as polyvinyl alcohol mixed with bichromate. On the red dyeing layer 11 is applied a photoresist 12 over which is placed a photomask 13 having opaque spots corresponding to an array of red-color dots. Using actinic radiation with a wavelength of 436 nm, photoresist 12 and dyeing layer 11 are patterned (FIG. 1D) to produce red-color filtering areas.

Figure 1E:
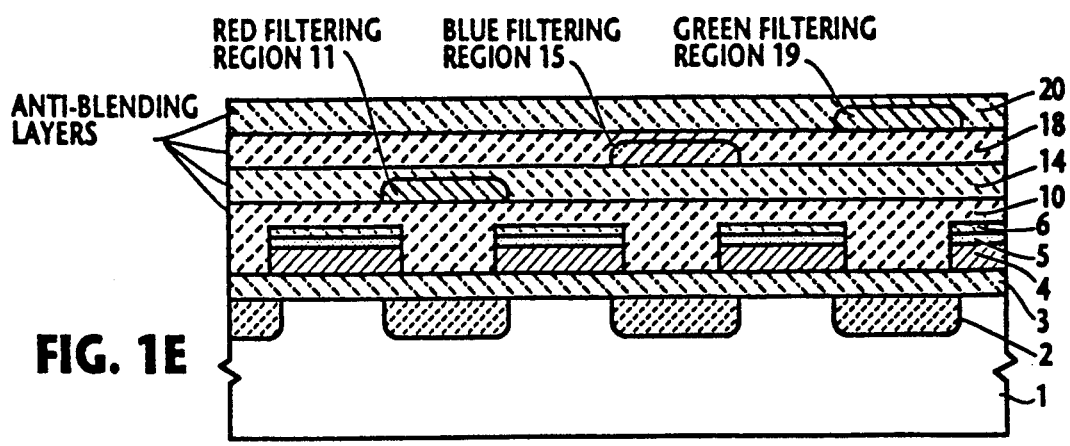

In a similar manner, an anti-blending layer 14 is then deposited to cover the patterned red dyeing layer 11 and a blue dyeing layer 15 is formed thereon. A photoresist 16 is applied onto the blue dyeing layer 15 and a photomask 17 having opaque areas corresponding to an array of blue-color dots is positioned over the blue dyeing layer 15. By actinic radiation through the photomask 17, photoresist 16 and blue dyeing layer 15 are patterned to produce blue-color filtering regions (FIG. 1E). A similar process is continued for green color by covering the blue filtering regions 15 with an anti-blending layer 18 on which a green dyeing layer 19 is formed. Green-color filtering regions 19 are formed and buried under a top layer 20 of anti-blending material.

Figure 3:
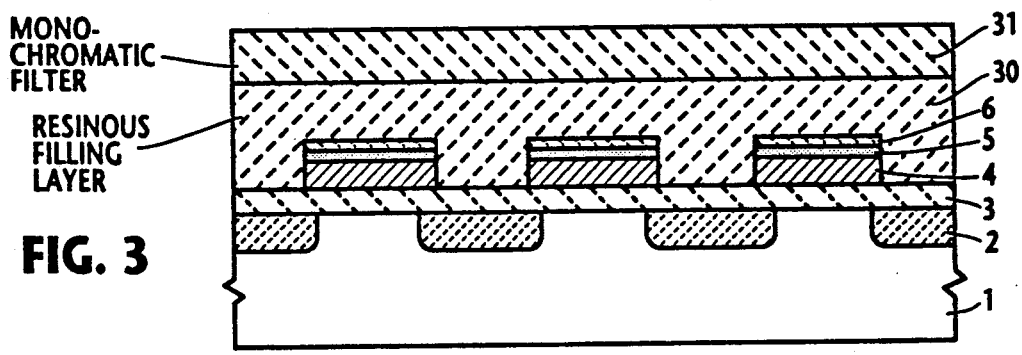
FIG. 3 is a side view of a solid-state monochromatic imaging device according to the present invention.
Figure 4:
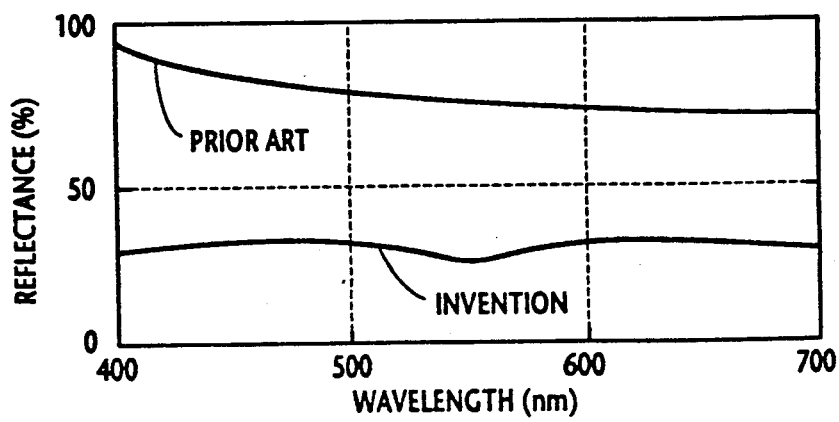
FIG. 4 is a graphic representation of the reflectance of the monochromatic imaging device of the invention in comparison with a prior art monochromatic imaging device.

In FIG. 3, a solid-state monochromatic imaging device embodying the present invention is shown. Instead of the anti-blending layer 10 of the previous embodiment, a resinous filling layer 30 is formed on the amorphous silicon layer 6 and a monochromatic filter 31 is cemented to the resinous layer 30. The purpose of the monochromatic filter 31 is to shield one edge of the imaging device from the incident light to be used during viewing for setting a zero light level. As shown in FIG. 4, the undesired reflection from the aluminum layer 4 is reduced significantly in comparison with the prior art over the full range of wavelengths from 400 nm to 700 nm. Due to the reduction of reflection from aluminum layer 4 multiple reflections which would otherwise occur between aluminum layer 4 and monochromatic filter 31 are reduced. The same advantage can also be obtained for the color imaging device if the front face of the device is coated with a monochromatic filter.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A solid-state imaging device comprising:
   a semiconductor substrate having a plurality of optoelectrical conversion regions on a major surface of the substrate;
   an insulating layer on said surface of the substrate;
   a light shielding layer on said insulating layer, said light shielding layer having a plurality of holes respectively aligned with said optoelectrical conversion regions; and
   an anti-reflection layer comprising an underlying silicon insulating layer on said light shielding layer and an overlying amorphous silicon layer on said underlying silicon insulating layer, said underlying silicon insulating layer and said overlying amorphous silicon layer producing destructive light interference for reducing light reflecting off said light shielding layer.

2. A solid-state imaging device as claimed in claim 1, wherein said underlying silicon insulating layer has a thickness of 1000 Å and said overlying amorphous silicon layer has a thickness of 300 Å.

3. A solid-state imaging device as claimed in claim 1, wherein said underlying silicon insulating layer has a thickness greater than the thickness of said overlying amorphous silicon layer.

4. A solid-state color imaging device comprising:
   a semiconductor substrate having a plurality of optoelectrical conversion regions on a major surface of the substrate;
   an insulating layer on the major surface of the substrate;
   a light shielding layer on said insulating layer, said light shielding layer having a plurality of holes respectively aligned with said optoelectrical conversion regions;
   an anti-reflection layer comprising an underlying silicon insulating layer on said light shielding layer and an overlying amorphous silicon layer on said underlying silicon insulating layer, said underlying silicon insulating layer and said overlying amorphous silicon layer producing destructive light interference for reducing light reflected from the light shielding layer;

a color anti-blending layer on said light reflecting layer; and a color dyeing layer on said color anti-blending layer, said color dyeing layer having an array of color filtering regions in positions corresponding to said optoelectrical conversion regions.

5. A solid-state imaging device as claimed in claim 4, wherein said underlying silicon insulating layer has a thickness of 1000 Å and said overlying amorphous silicon layer has a thickness of 300 Å.

6. A solid-state color imaging device as claimed in claim 5, wherein said underlying silicon insulating layer has a thickness greater than the thickness of said overlying amorphous silicon layer.

* * * * *